United States Patent [19]
Ma

[11] Patent Number: 4,761,825
[45] Date of Patent: Aug. 2, 1988

[54] TVRO EARTH STATION RECEIVER FOR REDUCING INTERFERENCE AND IMPROVING PICTURE QUALITY

[75] Inventor: John Y. Ma, Milpitas, Calif.

[73] Assignee: Capetronic (BSR) Ltd., Kowloon, Hong Kong

[21] Appl. No.: 792,784

[22] Filed: Oct. 30, 1985

[51] Int. Cl.$^4$ ............................................. H04B 1/26
[52] U.S. Cl. .................................... 455/183; 455/209; 455/260; 455/316; 455/186
[58] Field of Search ............... 455/183, 186, 196, 197, 455/207, 208, 209, 255, 256, 258, 259, 260, 264, 265, 314, 315, 316, 306, 307, 131

[56] References Cited

U.S. PATENT DOCUMENTS

| | | | |
|---|---|---|---|
| 3,639,840 | 2/1972 | Shekel et al. | 455/315 |
| 4,198,604 | 4/1980 | Holdaway | 455/260 |
| 4,267,605 | 5/1981 | Matsuzawa et al. | 455/315 |
| 4,479,257 | 10/1984 | Akiyama | 455/316 |
| 4,512,035 | 4/1985 | Victor et al. | 455/165 |
| 4,545,072 | 10/1985 | Skutta et al. | 455/183 |
| 4,551,856 | 11/1985 | Victor et al. | 455/183 |
| 4,661,995 | 4/1987 | Kashiwagi | 455/183 |

FOREIGN PATENT DOCUMENTS 223037A 5/1985 Fed. Rep. of Germany ...... 455/131

Primary Examiner—Jin F. Ng
Assistant Examiner—Elissa Seidenglane
Attorney, Agent, or Firm—Stephen G. Rudisill; Arnold, White & Durkee

[57] ABSTRACT

A method of reducing terrestrial interference is provided for a TVRO earth station receiver comprising a super-heterodyne circuit including a voltage-controlled oscillator (VCO), a mixer for combining incoming first IF signals with the output of the VCO to reduce the frequency of the first IF signals to a second IF range having a predetermined nominal center frequency, a pass band filter for filtering the second IF signals and having a pass band centered on the nominal second IF center frequency, and a microprocessor for controlling the input voltage to the VCO and for automatically setting the controlling input voltage at prescribed levels in response to a "channel select" command signal, so that the VCO produces an output frequency which centers the received signal for a selected channel on the nominal second IF center frequency. The method includes offsetting the controlling input voltage from the prescribed level for a selected channel to offset the actual second IF center frequency relative to the center of the pass band of the filter, in a direction that removes at least a portion of the terrestrial interference from the pass band.

13 Claims, 3 Drawing Sheets

TVRO EARTH STATION RECEIVER FOR REDUCING INTERFERENCE AND IMPROVING PICTURE QUALITY

FIELD OF THE INVENTION

The present invention relates generally to receivers for TVRO earth stations which receive video and audio signals from a plurality of orbiting earth satellites. More particularly, this invention relates to a TVRO receiver system which is capable of reducing the effects of terrestrial interference and other noise, and which is also capable of compensating for drift in the down converter at the antenna site.

BACKGROUND OF THE INVENTION

In satellite communication systems, a transmitting earth station generates a modulated carrier in the form of electromagnetic waves up to a satellite, forming an "uplink". The incident electromagnetic waves are collected by the satellite, processed electronically to reformat the modulated carrier in some way, and re-transmitted to receiving earth stations, forming a "downlink". The earth stations in such communication systems basically consist of a transmitting and/or receiving power station functioning in conjunction with an antenna subsystem and form strategic parts of the satellite communication system.

A TVRO earth station typically comprises a receiving antenna such as a paraboloidal dish, a low noise block (LNB) converter (or a low noise amplifier (LNA) and a down converter) located at an outdoor antenna site, and a receiver located near an indoor television set. The down converter and the receiver are usually connected by a coaxial cable.

One of the problems encountered in TVRO earth stations in certain parts of the country is terrestrial interference, which is commonly referred to as "TI". TI is caused by the presence of local terrestrial microwave communication links, and can cause substantial degradation of the signals received by TVRO earth stations from orbiting satellites. One of the most common manifestations of TI in an actual television picture is the appearance of either black or white "sparklies". If the TI is on one side of the center frequency of the transponder to which the receiver is tuned, the "sparklies" are white, and if the TI is on the other side of the center frequency, the "sparklies" are black.

TI can also lead to other problems in a TVRO earth station receiver. For example, if the receiver has AFC, it can attempt to lock onto the TI rather than the desired signals from a selected satellite transponder; although TI is more narrow-banded than the satellite signals, the TI often has a greater signal strength than the satellite signals. Furthermore, most terrestrial microwave signals are dithered, using a 30-Hz energy dispersal waveform, which can cause TI to move in and out of the bandwidth of the desired satellite signals, or back and forth between different portions of the bandwidth of the satellite signals.

Other problems that arise in TVRO earth stations can be caused by downconverter drift or the asymmetry of the satellite video signals. Commercially available downconverters can drift by as much as 4 MHz due to seasonal temperature variations, because these downconverters are normally located at the outdoor antenna site. This drift shifts the center frequencies of the various satellite channels away from the nominal center frequencies where they are expected to be located. A similar problem is presented by the asymmetry of the frequency-modulated satellite video signals. Unlike amplitude-modulated video signals, the signal spectra of the satellite video signals are often (but not always) asymmetrical, which causes the centers of the signal spectra to be offset from the respective nominal center frequencies.

SUMMARY OF THE INVENTION

It is a primary object of the present invention to provide an improved TVRO earth station receiving system which permits the effects of TI to be significantly reduced.

A further object of this invention is to provide an improved TVRO earth station receiver which permits the user to intervene in the system to reduce the effects of TI as manifested in the actual television picture.

It is another important object of this invention to provide such an improved TVRO earth station receiver which compensates for drift in the down converter due to temperature fluctuations and the like.

Yet another object of the invention is to provide an improved TVRO receiver which is capable of compensating for the asymmetry of the signal spectra of frequency-modulated satellite video signals.

Other objects and advantages of the invention will be apparent from the following detailed description and the accompanying drawings.

In accordance with the present invention, there is provided a method of reducing terrestrial interference in a TVRO earth station receiver that includes a superheterodyne circuit including a voltage-controlled oscillator (VCO), means for supplying a controlling input voltage to the VCO, and a mixer for combining incoming 1st IF signals with the output of the VCO to reduce the frequency of the 1st IF signals to a 2nd IF range having a predetermined nominal center frequency; means for generating a "channel select" command signal; means for automatically setting the controlling input voltage at prescribed levels, in response to the "channel select" command signal, so that the VCO produces an output frequency which centers the received signal for the selected channel on the nominal 2nd IF center frequency; and a passband filter for filtering the 2nd IF signals and having a pass band centered on the nominal 2nd IF center frequency. The method comprises offsetting the controlling input voltage from the prescribed level for a selected channel to offset the actual 2nd IF center frequency relative to the center of the pass band of the filter, in a direction that removes at least a portion of the terrestrial interference from the pass band.

There is also provided a method of tuning such a VRO earth station receiver by offsetting the controlling input voltage from the prescribed level for a selected channel (1) by an amount sufficient to center a received signal that is offset from the nominal center frequency of the selected channel, on the nominal 2nd IF center frequency, and/or (2) to offset the actual 2nd IF center frequency relative to the center of the pass band of the filter, in a direction that moves the center of the signal spectrum toward the center of the pass band of the filter.

BRIEF DESCRIPTION OF THE DRAWINGS

The invention and further objects and advantages thereof may best be understood by reference to the following description taken in conjunction with the accompanying drawings, in which.

DESCRIPTION OF THE PREFERRED EMBODIMENT

Although the invention will be described in connection with certain preferred embodiments, it will be understood that it is not intended to limit the invention to these particular embodiments. On the contrary, it is intended to cover all alternatives, modifications and equivalent arrangements as may be included within the spirit and scope of the invention as defined by the appended claims.

Figure 1:
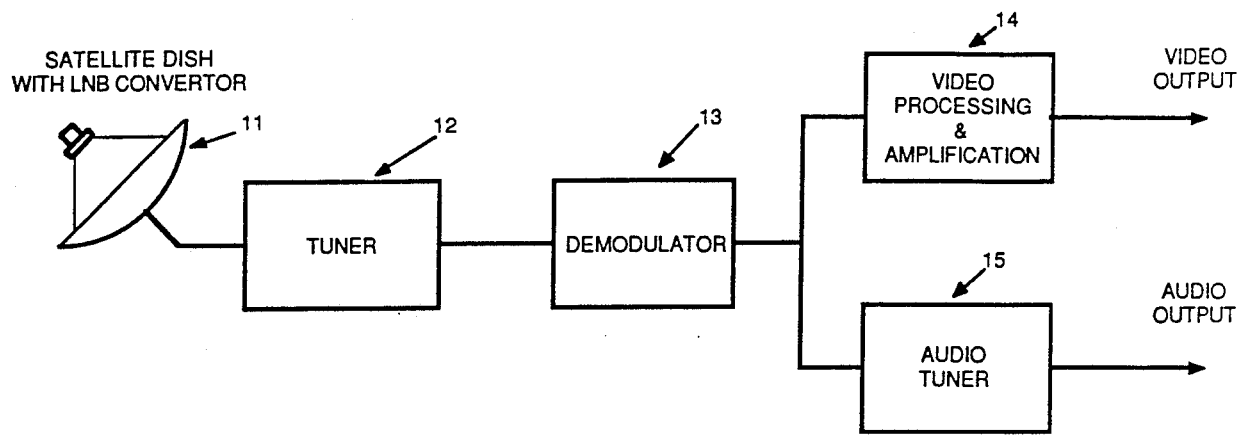
FIG. 1 is a block diagram of a conventional TVRO earth station.

Referring now to the drawings, in FIG. 1 there is shown a functional block diagram of a TVRO earth station for the reception of satellite signals. The system includes an antenna 11, which is typically a paraboloidal dish equipped with a low noise block (LNB) converter and related accessories and positioning mechanisms, for capturing signals transmitted from orbiting satellites; and a receiver system including a tuner 12, a demodulator 13, a video processing and amplification section 14, and an audio tuner 15.

The antenna 11 receives signals transmitted from the satellite in the four-GHz frequency band (3.7 to 4.2 GHz); and this entire block of frequencies is converted to a 1st IF frequency range of 950 to 1450 MHz by the block converter located at the antenna site. The 1st IF signals are then sent via coaxial cable to the tuner 12 which selects a particular channel for viewing and converts the signals in that particular channel to a 2nd IF frequency range. The 2nd IF frequency range is preferably high enough to permit the 2nd IF VCO frequencies to be above the 1st IF block of frequencies, to prevent the VCO from interfering with the desired signals. For a 1st IF frequency range of 950 to 1450 MHz, this means that the center frequency of the second IF frequency range must be at least 500 MHz. A particularly preferred 2nd IF center frequency in the system of the present invention is 612 MHz.

In the demodulator 13, the 2nd IF signal is passed through an amplifier and a filter and on to a conventional video detector which demodulates the frequency-modulated signal to the baseband of the original video signal (e.g., 0 to 10 MHz), producing a composite video signal output. The filter preferably has a pass band that is only about 22 MHz wide; a pass band of this width passes the essential video and audio information while rejecting unwanted noise received by the antenna on the edges of the selected channel. The output of the demodulator comprises the baseband signals which range from DC to about 8.5 MHz; this includes video information from about 15 KHz to 4.2 MHz, and subcarriers from about 4.5 to 8.5 MHz.

Figure 2:
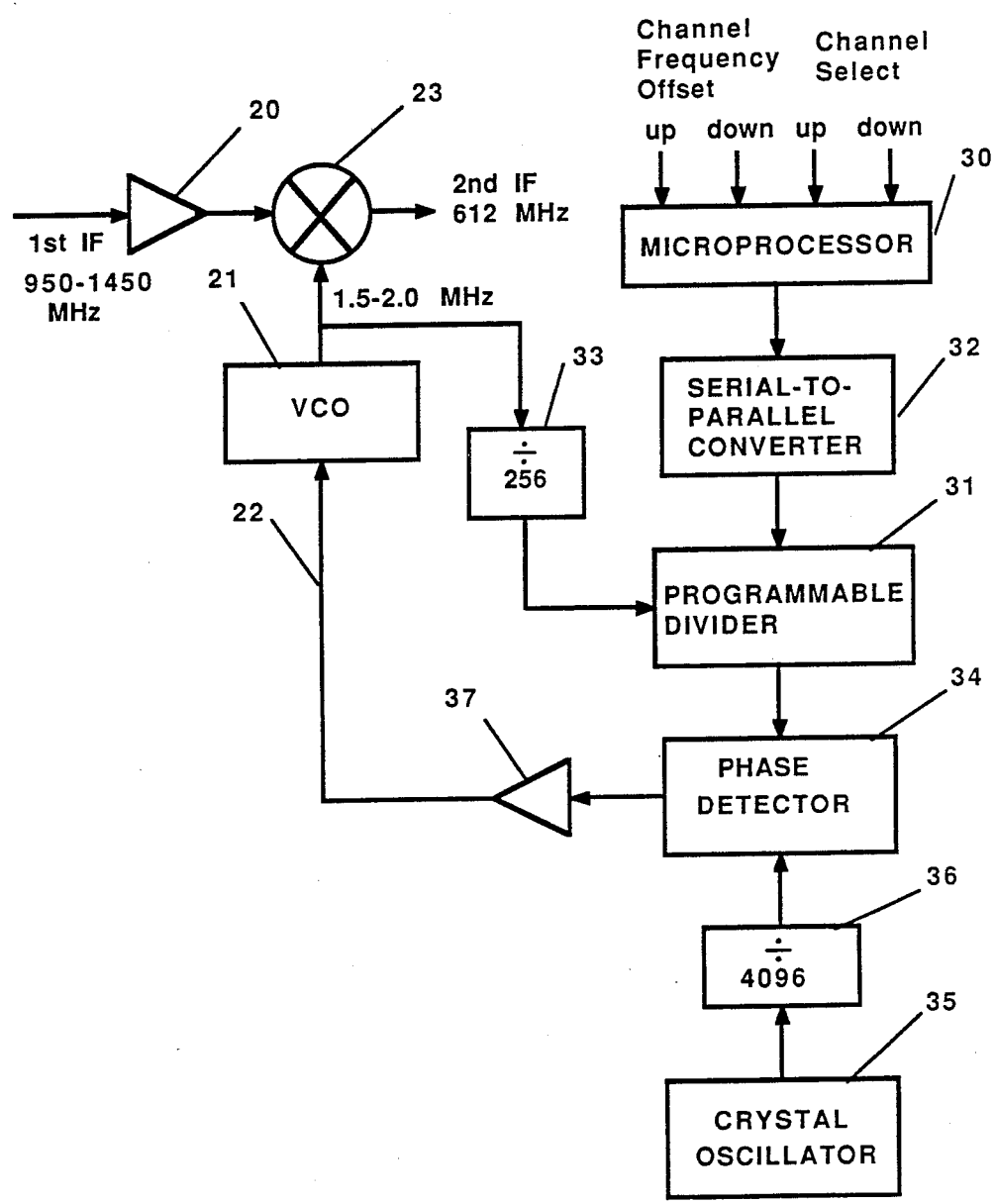
FIG. 2 is a block diagram of a TVRO earth station receiver embodying the present invention.

FIG. 2 shows a suitable tuner 12 for use in the TVRO system of FIG. 1. This tuner 12 includes a preamplifier 20 followed by a superheterodyne circuit including a voltage-controlled oscillator (VCO) 21 receiving a controlling input voltage on line 22, and a mixer 23 for combining the output of the VCO 21 with the 1st IF output of the amplifier 20 to reduce the frequency of the 1st IF signals to a desired 2nd IF frequency, e.g., 612 MHz. The resulting 2nd IF signals are passed through a pair of amplifiers 24 and 25 and then on to the demodulator 13. By adjusting the controlling input voltage supplied to the VCO 21 via line 22, different channels (frequency bands) in the 1st IF signals are centered on the center frequency of the 2nd IF output of the mixer 23. Each channel typically contains at least a video carrier signal, a color subcarrier signal, and an audio subcarrier signal at different prescribed frequencies. These carrier and subcarrier signals for all the channels are transmitted simultaneously from the satellite to the earth station.

The following "Table I" is a list of the center frequencies for 24 transponders on a single satellite. Table I also lists the corresponding center frequencies in the output from the block converter (identified in Table I as the 1st IF center frequencies) and the output frequencies required from the VCO 21 in order to tune the receiver to each individual transponder. It will be noted that the difference between the 1st IF center frequency and the corresponding VCO output frequency for each transponder is 612 MHz, which means that the center frequency of the 2nd IF output from the mixer 23 is 612 MHz for every transponder. That is, the VCO output frequencies listed in Table I will cause the 612-MHz output frequency of the mixer 23 to be centered on the corresponding 1st IF center frequency. For example, a VCO output frequency of 2042 MHz will cause the 612-MHz output frequency of the mixer to be centered on the 1430-MHz 1st IF center frequency of transponder No. 1.

TABLE I

| Transponder Number ("Channel") | Transponder Center Freq. | 1st IF Center Freq. | VCO Output Freq. | 2nd IF Center Freq. |
|---|---|---|---|---|
| 1 | 3720 MHz | 1430 MHz | 2042 MHz | 612 MHz |
| 2 | 3740 | 1410 | 2022 | 612 |
| 3 | 3760 | 1390 | 2002 | 612 |
| 4 | 3780 | 1370 | 1982 | 612 |
| 5 | 3800 | 1350 | 1962 | 612 |
| 6 | 3820 | 1330 | 1942 | 612 |
| 7 | 3840 | 1310 | 1922 | 612 |
| 8 | 3860 | 1290 | 1902 | 612 |
| 9 | 3880 | 1270 | 1882 | 612 |
| 10 | 3900 | 1250 | 1862 | 612 |
| 11 | 3920 | 1230 | 1842 | 612 |
| 12 | 3940 | 1210 | 1822 | 612 |
| 13 | 3960 | 1190 | 1802 | 612 |
| 14 | 3980 | 1170 | 1782 | 612 |
| 15 | 4000 | 1150 | 1762 | 612 |
| 16 | 4020 | 1130 | 1742 | 612 |
| 17 | 4040 | 1110 | 1722 | 612 |
| 18 | 4060 | 1090 | 1702 | 612 |
| 19 | 4080 | 1070 | 1682 | 612 |
| 20 | 4100 | 1050 | 1662 | 612 |
| 21 | 4120 | 1030 | 1642 | 612 |
| 22 | 4140 | 1010 | 1622 | 612 |
| 23 | 4160 | 990 | 1602 | 612 |
| 24 | 4180 | 970 | 1582 | 612 |

Figure 3:
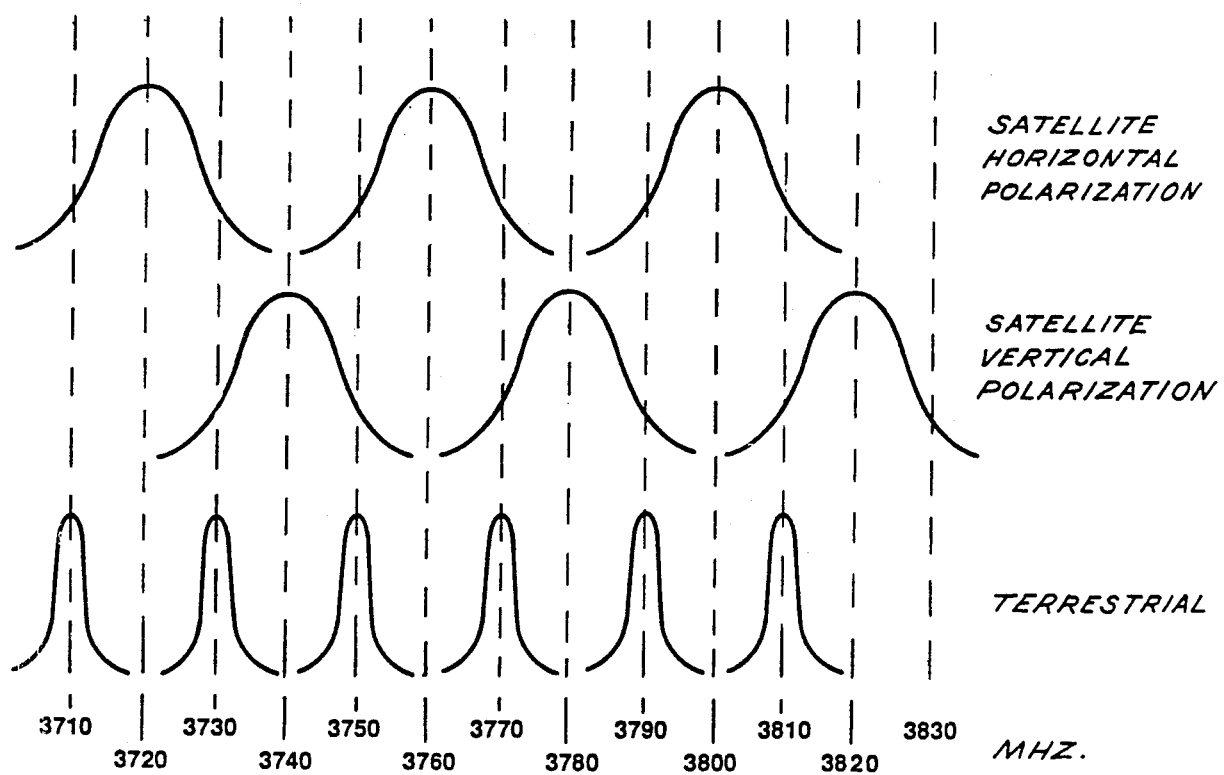
FIG. 3. is a diagrammatic illustration of exemplary signal spectra from multiple satellite transponders having adjacent center frequencies, and from multiple terrestrial microwave communication channels having center frequencies located between those of the satellite channels.

As the antenna position is adjusted to point the antenna at different satellites, the effect of TI on the satellite signals being received can vary considerably, depending upon how much of nearby terrestrial signals are "seen" by the satellite antenna in its different positions. Furthermore, each satellite normally has many different transponders operating at different frequencies, and thus the effects of TI can also vary as the receiver is tuned to different transponders on a single satellite. For example, as partially illustrated in FIG. 3, a typical satellite today has 24 transponders operating at frequencies ranging from 3.72 GHz to 4.18 GHz, centered on even multiples of 10 MHz at 20-MHz intervals. As also illustrated in FIG. 3, alternate transponders on a given satellite usually transmit signals with a first polarization, e.g., horizontal, while the intervening transponders transmit signals with a second polarization orthogonal to the first.

Terrestrial microwave links operate in the same frequency range and at 20-MHz intervals, but have narrower bandwidths and are centered on odd multiples of 10 MHz. Nevertheless, as can be seen from FIG. 3, there is still considerable overlap between the satellite signals and the terrestrial signals. The degree of interference produced, however, can vary widely from transponder to transponder, and from satellite to satellite depending upon which terrestrial channels are being used in the interfering link, and at what polarizations and power levels.

Another problem is that the LNB converter, or LNA and down converter, located at the outdoor antenna site, can drift due to fluctuations in the ambient outdoor temperature. It is not unusual for an LNB to drift by as much as 4 MHz over the full range of seasonal temperature changes in certain geographical regions. This drift, of course, offsets the actual center frequency of the 1st IF signals for any given channel from the nominal center frequency of that particular channel. As a result, the desired signals can be shifted outside the pass band of one or more of the filters downstream from the converter.

In accordance with the present invention, the satellite receiver includes means for generating a "channel frequency offset" command signal, and means responsive to that command signal for introducing an offset into the controlling input voltage to the VCO, thereby producing a corresponding offset in the output frequency of said VCO, so that the IF center frequency of the tuner output is offset from the true center frequency of a selected transponder frequency band in the incoming signals. As mentioned previously, terrestrial interference is usually detectable by the user because it produces black or white "sparklies" in the video image. With the system of this invention, the user who detects such interference can reduce or even eliminate the adverse effect of the TI by introducing an offset for the particular transponder signal being received at the moment and visually determining the effect of the offset. As will be explained in more detail below, the user can introduce offsets in either direction, and can increase or decrease the magnitude of offset in each direction, to achieve the optimum offset for each individual transponder. This optimum offset is then stored in a memory and automatically introduced the next time the receiver is tuned to that same transponder or "channel".

Unlike frequency-modulated audio signals, frequency-modulated video signals produce a signal spectrum which is asymmetrical about the IF center frequency. For this reason, improved video pictures can be obtained by offsetting the center of the response curve of the bandpass filter in the demodulator from the IF center frequency, as described in Ma et al. copending U.S. patent application Ser. No. 792,767, filed Oct. 30, 1985 for TVRO receiver system with low-cost video-noise reduction filter. Specifically, the center of the pass band of the filter is aligned with the true center frequency of the signal spectrum of the IF video signal, which is typically 615 MHz when the IF center frequency is 612 MHz.

Certain satellite signals, however, still produce signal spectra which are symmetrical about the IF center frequency. Thus, a filter which is properly centered for the signals with asymmetrical spectra cuts off a portion of the signals having symmetrical spectra. With the system of the present invention, this dilemma can be solved by offsetting the output frequency of the VCO to shift the IF center frequency to the spectral center frequency of only those signals having asymmetrical spectra.

The VCO offset can also be used to compensate for drift in the down converter, e.g., due to temperature fluctuations. As explained above, such drift introduces errors in the actual center frequencies of the various channels, i.e., the actual 1st IF center frequencies are different from the nominal 1st IF center frequencies listed in Table I. By offsetting the corresponding VCO output frequencies from the values listed in Table I, these errors can be corrected. For example, if the down-converter has undergone a +2 MHz drift, the actual 1st IF center frequency for transponder No. 1 will be 1432 MHz rather than the nominal 1430 MHz. But, by offsetting the VCO output frequency from 2042 MHz to 2044 MHz, the signals from transponder No. 1 will still be centered on the desired 612-MHz 2nd IF center frequency.

In the illustrative embodiment of FIG. 2, the "channel frequency offset" command signal generated by the user is applied to a microprocessor 30 which responds by supplying a binary bit stream, representing a predetermined binary number, to the controlling input of a 14-bit programmable divider 31 via a serial-to-parallel converter 32. The input signal to the divider 31 is the output of the VCO 21 which is scaled down by passing it through a divider 33 before it reaches the divider 31. This additional divider permits the use of a CMOS chip for the divider 31, which is an advantage because it has a sufficiently low current drain that no shielding is required. In the illustrative example of FIG. 2, the divider 33 is set to divide the VCO output frequency by 256. The programmable divider 31 then further divides the VCO output frequency by a number determined by the input received from the microprocessor 30. The resulting output signal from the divider 31 is then applied to a digital phase detector 34.

The microprocessor 30 and the programmable divider 31 are used to adjust the controlling input voltage to the VCO 21 for normal tuning purposes, as well as for introducing the offsets described above. The following "Table II" is a list of the hexidecimal numbers that the microprocessor 30 supplies to the divider 31 to produce the desired VCO output frequencies listed in Table I for the 24 transponders on a typical satellite. The ensuing description will explain how the programmable divider 31 and the controlling hexidecimal numbers that it receives from the microprocessor 30 control the input voltage to the VCO 21 to produce the desired VCO output frequencies.

TABLE II

| VCO Output Freq. | HEX No. |
|---|---|
| 2042 MHz | 7FA |
| 2022 | 7E6 |
| 2002 | 7D2 |
| 1982 | 7BE |
| 1962 | 7AA |
| 1942 | 796 |
| 1922 | 782 |
| 1902 | 76E |
| 1882 | 75A |
| 1862 | 746 |
| 1842 | 732 |
| 1822 | 71E |
| 1802 | 70A |
| 1782 | 6F6 |
| 1762 | 6E2 |
| 1742 | 6CE |
| 1722 | 6BA |
| 1702 | 6A6 |
| 1682 | 692 |
| 1662 | 67E |
| 1642 | 66A |
| 1622 | 656 |
| 1602 | 642 |
| 1582 | 62E |

Still referring to FIG. 2, the phase detector 34 receives a second input signal from a reference oscillator 35, which is a crystal oscillator so that it produces a stable output at a fixed frequency. Low-cost crystal oscillators typically produce an output frequency of 4 MHz, so the oscillator output is passed through a divider 36 which divides the oscillator output frequency by a fixed number, e.g., 4096, to produce a reference signal in the optimum frequency range (for maximum accuracy) for the digital phase detector 34.

In response to the two input signals from the dividers 31 and 36, the phase detector 34 produces a pulsating DC voltage which is filtered to a smooth DC voltage by a filtering amplifier 37. The magnitude of this DC voltage is proportional to the difference between the frequencies of the two input signals, and is applied to the VCO 21 as its controlling input voltage. Since the reference frequency from the oscillator 35 is constant, the magnitude of the DC output voltage from the phase detector 34 is determined by the output frequency of the VCO 21 as modified by the programmable divider 31. Thus, it can be seen that the setting of the divider 31, in response to the controlling input signals from the microprocessor 30, actually determines the magnitude of the DC output voltage, which in turn determines the output frequency of the VCO 21. This entire control loop is a phase-locked loop, and the combination of the programmable divider 31, the converter 32, the phase detector 34, the oscillator 35 and the divider 36 is available in the form of an integrated circuit, such as the MC145155-1 "Serial Input PLL Frequency Synthesizer" made by Motorola, Inc.

In the absence of a "channel frequency offset" command signal, the microprocessor 30 sets the programmable divider 31 to maintain the output of the phase detector 34 at a level which tunes the heterodyne circuit to the center frequency of the desired transponder selected by a "channel select" command signal. For example, in the case of the 24-transponder satellite described above, the receiver is tuned to transponder No. 1 by adjusting the input voltage to the VCO 21 to produce a VCO output frequency of 2042 MHz so that the 1430-MHz 1st IF signal, which is the center frequency of transponder No. 1, is locked onto the 612-MHz center frequency of the 2nd IF output of the mixer 23. To switch to transponder No. 2, which has a 1st IF center frequency of 1410 MHz, the divider 31 is re-set to produce a DC voltage on line 22 which shifts the output frequency of the VCO to 2022 MHz. As indicated in FIG. 2, the "channel select" signal can command either an increase or a decrease in the VCO output frequency. This normal tuning operation is, of course, conventional.

In order to introduce an offset into the tuner, in response to a manually initiated "channel frequency offset" command signal, the microprocessor 30 adjusts the divider 31 to increase or decrease the DC output of the phase detector 34 by an amount which shifts the output frequency of the VCO by 1 MHz, thereby centering the 612-MHz 2nd IF output frequency on a 1st IF frequency 1 MHz away from the true center frequency of the transponder. For example, again using transponder No. 1 in the satellite described above as an example, increasing the output frequency of the VCO from 2042 MHz to 2043 MHz causes the 612-MHz center frequency of the IF output to be shifted from 1430 MHz to 1431 MHz in the 1st IF signals. As in the case of the "channel select" signal, and as indicated in FIG. 2, the "channel frequency offset" signal can command an offset in either direction from the nominal center frequency.

Figure 4A:
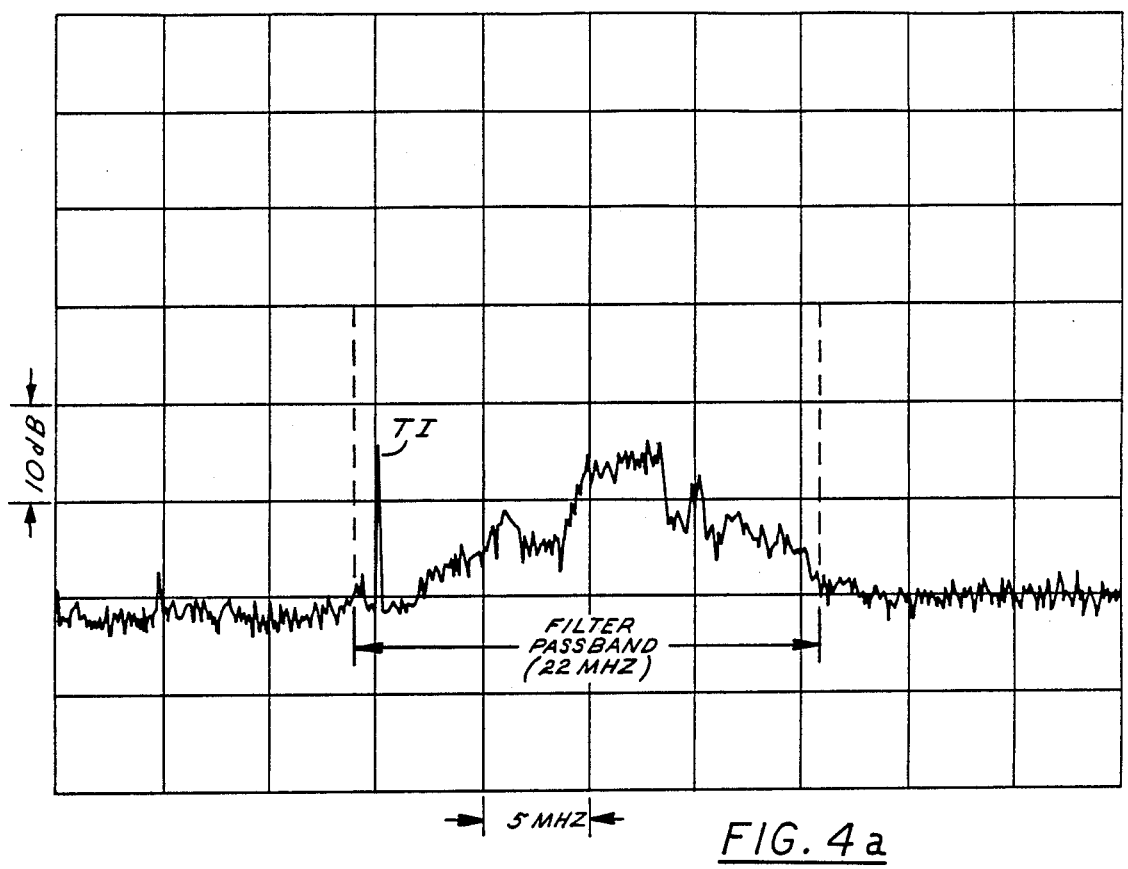
FIGS. 4A and 4B are graphs which diagramatically illustrate satellite television signal spectra and associated TI as a function of frequency.
Figure 4B:
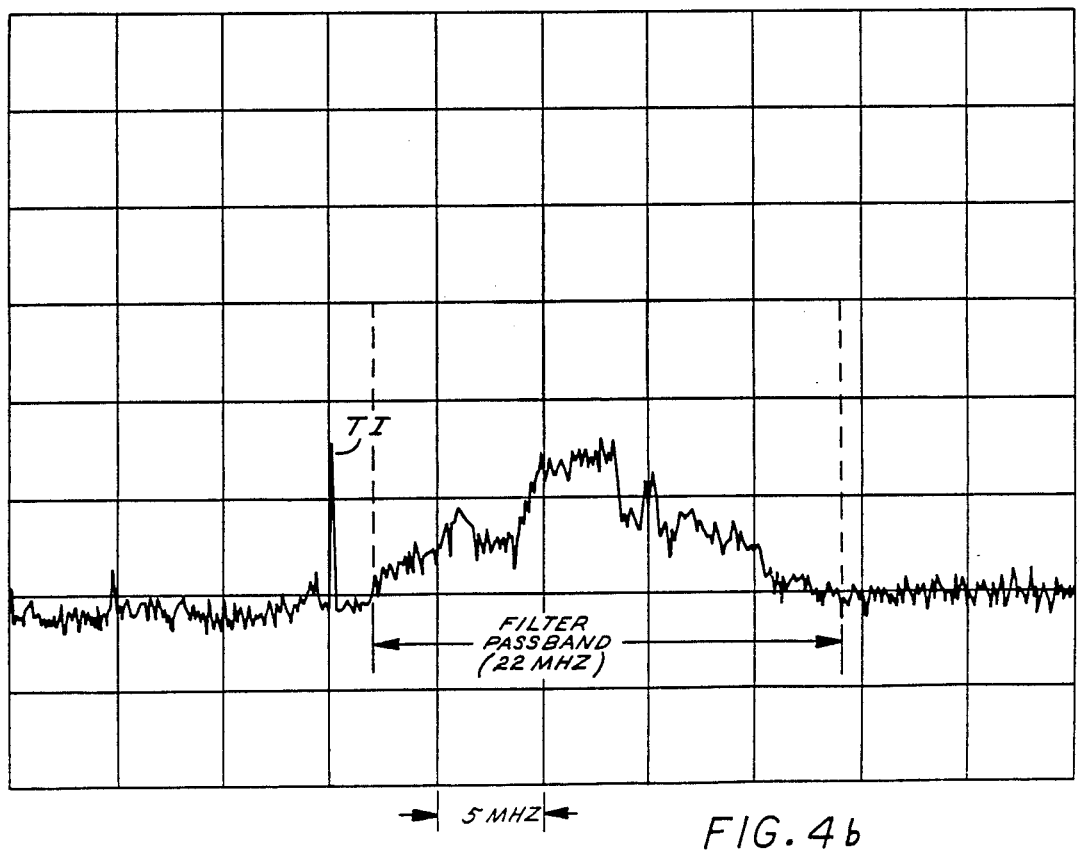

This effect is demonstrated more clearly by the graphical illustrations in FIGS. 4a and 4b. These drawings illustrate the offset required in tuning to transponder No. 3, which has a center frequency of 3760 MHz, to avoid TI centered at 3770 MHz. FIG. 4a shows the effect of the TI without any offset in the tuner. The broken lines represent the bandwidth that is passed by the demodulator filter in the absence of any offset. This filter typically has a pass band of 22 MHz, which means that the filter passes the satellite signals in the range of 3749 MHz to 3771 MHz when the receiver is locked onto the nominal center frequency of transponder No. 3, i.e., 3760 MHz. It can be seen that in this mode of operation a substantial portion of the TI will be passed by the filter, and thus will produce significant interference in the displayed video image.

FIG. 4b illustrates the effect of introducing a 3-MHz offset in the tuner. By shifting the output frequency of the VCO from 2002 MHz to 1999 MHz, the 612-MHz center frequency of the IF output is in effect shifted from the true transponder center frequency of 3760 MHz to an offset center frequency of 3757 MHz. Thus, the frequency band passed by the demodulator filter, which is illustrated by the broken lines in FIG. 4b, is shifted to the band extending from 3747 MHz to 3767 MHz, thereby eliminating the TI from the pass band. This offset naturally results in some loss of the desired video signal, but any resulting slight degradation of the picture quality is negligible in comparison with the improvement achieved by eliminating the TI.

The asymmetrical nature of the video signal spectrum can also be seen in FIGS. 4a and 4b. In FIG. 4a, the filter passband is centered on the nominal center frequency, and it can be seen that the center of the signal spectrum is offset to the right of the center frequency. The shift from FIG. 4a to FIG. 4b provides optimum alignment of the asymmetrical signal spectrum within the filter's pass band, as well as eliminating the TI. However, it can be seen from FIG. 4b that a symmetrical signal spectrum would be offset from the center of a filter pass band located in the position relative to the signal; with the system of this invention, that situation could be remedied by offsetting the VCO output frequency to shift the signal to the right until it is properly centered in the filter pass band. Of course, such a shift might not be advantageous if TI were present at the location illustrated in FIG. 4b, but the user can offset the VCO in increments of 1 MHz until the optimum setting is achieved.

The signal shift from FIG. 4a to 4b, relative to the filter pass band illustrated in those figures, is the same shift that would be effected to compensate for drift in the down converter.

As can be seen from the foregoing detailed description, this invention provides an improved TVRO earth station receiving station which permits the effects of TI to be significantly reduced. This system permits the user to intervene in the system to reduce the effects of TI as manifested by "sparklies" or other interference in the television picture. The receiver also permits compensation for drift in the down converter due to temperature fluctuations and the like, and also permits compensation for the asymmetry of frequency-modulated satellite video signals.

I claim:

1. A method of reducing terrestrial interference in a TVRO earth station receiver for receiving signals broadcast over a plurality of channels and centered within a range of frequencies having a nominal center frequency, said receiver comprising
   a superheterodyne circuit including a voltage-controlled oscillator (VCO), means for supplying a controlling input voltage to said VCO, and a mixer for combining incoming 1-st IF signals with the output of said VCO to reduce the frequency of the 1st IF signals to a 2nd IF range having a predetermined nominal center frequency,
   means for generating a "channel select" command signal,
   means for automatically setting the controlling input voltage at predetermined levels, in response to said "channel select" command signal, so that the VCO produces an output frequency which centers the 1st IF signal corresponding to received signals for a selected channel on the nominal 2nd IF center frequency, and
   a passband filter for filtering the 2nd IF signals and having a pass band centered on the nominal 2nd IF center frequency,
   said method comprising
   offsetting said controlling input voltage from the predetermined level for a selected channel to offset the actual 2nd IF center frequency relative to the center of the pass band of said filter, in a direction that removes at least a portion of terrestrial interference from said pass band.

2. The method of claim 1 wherein said controlling input voltage is offset in response to a manually initiated "channel frequency offset" command signal.

3. The method of claim 2 wherein said controlling input voltage is controlled by a microprocessor responsive to said "channel select" and "channel frequency offset" command signals, and by a feedback signal responsive to the output frequency of said VCO.

4. The method of claim 3 wherein said microprocessor is programmed to select said prescribed levels for said controlling input voltage in response to said "channel select" command signal.

5. A method of tuning a TVRO earth station receiver for receiving video and audio signals broadcast over a plurality of channels and centered within a range of frequencies having a nominal center frequency, said signals including signals centered at a frequency which is offset from the nominal center frequency of received signals, said receiver comprising a superheterodyne circuit including a voltage-controlled oscillator (VCO), means for supplying a controlling input voltage to said VCO, and a mixer for combining incoming 1st IF signals with the output of said VCO to reduce the frequency of the 1st IF signals to a 2nd IF range having a predetermined nominal center frequency,
   means for generating a "channel select" command signal, and
   means for automatically setting the controlling input voltage at predetermined levels, in response to said "channel select" command signal, so that the VCO produces an output frequency which centers the received signal for a selected channel on the nominal 2nd IF center frequency,
   said method comprising
   offsetting said controlling input voltage from the predetermined level for a selected channel by an amount sufficient to center a received signal that is offset from the nominal center frequency of the selected channel, on the nominal 2nd IF center frequency.

6. The method of claim 5 wherein said controlling input voltage is offset in response to a manually initiated "channel frequency offset" command signal.

7. The method of claim 6 wherein said controlling input voltage is controlled by a microprocessor responsive to said "channel select" and "channel frequency offset" command signals, and by a feedback signal responsive to the output frequency of said VCO.

8. The method of claim 7 wherein said microprocessor is programmed to select said prescribed levels for said controlling input voltage in response to said "channel select" command signal.

9. A method of tuning a TVRO earth station receiver for optimum reception of frequency-modulated video signals broadcast over a plurality of channels and centered within a range of frequencies having a nominal center frequency, said signals having asymmetrical signal spectra and being centered at a frequency offset from said nominal center frequency, said receiver comprising
   a superheterodyne circuit including a voltage-controlled oscillator (VCO), means for supplying a controlling input voltage to said VCO, and a mixer for combining incoming 1st IF signals with the output of said VCO to reduce the frequency of the 1st IF signals to a 2nd IF range having a predetermined nominal center frequency,
   means for generating a "channel select" command signal,
   means for automatically setting the controlling input voltage at predetermined levels, in response to said "channel select" command signal, so that the VCO produces an output frequency which centers the received signal for the selected channel on the nominal 2nd IF center frequency, and a pass band filter for filtering the 2nd IF signals and having a pass band centered on the nominal 2nd IF center frequency, said method comprising offsetting said controlling input voltage from the predetermined level for a selected channel to offset the actual 2nd IF center frequency relative to the center of the pass band of said filter, in a direction that moves the frequency at which the received signals are centered toward the center of the pass band of said filter.

10. A TVRO earth station receiver for receiving signals broadcast over a plurality of channels and centered within a range of frequencies having a nominal center frequency, said receiver comprising a superheterodyne circuit including a voltage-controlled oscillator (VCO), means for supplying a controlling input voltage to said VCO, and a mixer for combining incoming 1st IF signals with the output of said VCO to reduce the frequency of the 1st IF signals to a 2nd IF range having a predetermined nominal center frequency, means for generating a "channel select" command signal, means for automatically setting the controlling input voltage at predetermined levels, in response to said "channel select" command signal, so that the VCO produces an output frequency which centers the received signal for a selected channel on the nominal 2nd IF center frequency, a pass band filter for filtering the 2nd IF signals and having a pass band centered on the nominal 2nd IF center frequency, and means for offsetting said controlling input voltage from the prescribed level for a selected channel to offset the actual 2nd IF center frequency relative to the center of the pass band of said filter.

11. The TVRO received of claim 10 which includes means for generating a "channel frequency offset" command signal, and means for offsetting said controlling input voltage in response to said "channel frequency offset" command signal.

12. The TVRO received of claim 11 which includes a microprocessor for controlling the offset of said controlling input voltage in response to said "channel select" and "channel frequency offset" command signals, and a feedback signal responsive to the output frequency of said VCO.

13. The TVRO receiver of claim 12 wherein said microprocessor is programmed to select said prescribed levels for said controlling input voltage in response to said "channel select" command signal.

* * * * *